United States Patent
Su et al.

(10) Patent No.: US 7,897,433 B2
(45) Date of Patent: Mar. 1, 2011

(54) SEMICONDUCTOR CHIP WITH REINFORCEMENT LAYER AND METHOD OF MAKING THE SAME

(75) Inventors: Michael Su, Round Rock, TX (US);
Frank Kuechenmeister, Dresden (DE);
Jaime Bravo, Santiago (CL)

(73) Assignee: Advanced Micro Devices, Inc., Sunnyvale, CA (US)

( * ) Notice: Subject to any disclaimer, the term of this patent is extended or adjusted under 35 U.S.C. 154(b) by 8 days.

(21) Appl. No.: 12/388,092

(22) Filed: Feb. 18, 2009

(65) Prior Publication Data

US 2010/0207281 A1 Aug. 19, 2010

(51) Int. Cl.
*H01L 21/00* (2006.01)
*H01L 23/58* (2006.01)

(52) U.S. Cl. .............. 438/108; 257/643; 257/701; 257/738; 257/792

(58) Field of Classification Search .............. None
See application file for complete search history.

(56) References Cited

U.S. PATENT DOCUMENTS

| | | | |
|---|---|---|---|
| 5,854,141 | A | 12/1998 | Cronin et al. |
| 6,022,791 | A | 2/2000 | Cook et al. |
| 6,049,124 | A | 4/2000 | Raiser et al. |
| 6,288,439 | B1 | 9/2001 | Bandou |
| 6,493,229 | B2 | 12/2002 | Akram et al. |
| 2002/0043721 | A1 | 4/2002 | Weber |
| 2003/0171001 | A1 | 9/2003 | Shinohara |
| 2004/0026785 | A1 | 2/2004 | Tomita |
| 2004/0188136 | A1 | 9/2004 | Sunohara et al. |
| 2006/0180929 | A1 | 8/2006 | Kroehnert et al. |
| 2006/0278957 | A1 | 12/2006 | Lin et al. |
| 2007/0069336 | A1 | 3/2007 | Ning |
| 2007/0138635 | A1 | 6/2007 | Ikumo et al. |
| 2008/0073780 | A1 | 3/2008 | Imori |
| 2008/0083959 | A1 | 4/2008 | Wu et al. |
| 2008/0169555 | A1 | 7/2008 | Topacio |
| 2009/0032909 | A1 | 2/2009 | Brofman et al. |
| 2009/0166836 | A1 | 7/2009 | Kim et al. |
| 2010/0019381 | A1 | 1/2010 | Haeberlen et al. |

OTHER PUBLICATIONS

Guotao Wang et. al.; *Chip packaging interaction: a critical concern for Cu/low k packaging*; www.sciencedirect.com; Microelectronics Reliability 45 (2005) 1079-1093.

Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06/ $20.00 © 2006 IEEE; pp. 1595-1603.

(Continued)

*Primary Examiner* — Alonzo Chambliss
(74) *Attorney, Agent, or Firm* — Timothy M. Honeycutt

(57) ABSTRACT

Various semiconductor chip reinforcement structures and methods of making the same are disclosed. In one aspect, a method of manufacturing is provided that includes providing a semiconductor chip that has a side and forming a polymer layer on the side. The polymer layer has a central portion and a first frame portion spatially separated from the central portion to define a first channel. An underfill material may be provided to invade the channel and establish a mechanical joint between the polymer layer and the underfill material.

21 Claims, 7 Drawing Sheets

OTHER PUBLICATIONS

John Baliga; *Yet Another Way to Use BCB*; Semiconductor International; http://www.semiconductor.net/article/CA6347341.html; Jul. 1, 2006; pp. 1-3.
U.S. Appl. No. 11/853,122, filed Sep. 11, 2007, Michael Su et al.
U.S. Appl. No. 12/132,734, filed Jun. 4, 2008, Michael Su et al.
U.S. Appl. No. 12/388,064, filed Feb. 18, 2009, Michael Z. Su et al.

USPTO Office Action mailed Jul. 9, 2009; U.S. Appl. No. 11/853,122.
PCT/US2010/024462 Partial International Search Report; Jun. 23, 2010.
PCT/US2010/024462 International Search Report mailed Dec. 14, 2010.
USPTO Office Action notification date Jan. 6, 2011; U.S. Appl. No. 12/721,289.

SEMICONDUCTOR CHIP WITH REINFORCEMENT LAYER AND METHOD OF MAKING THE SAME

BACKGROUND OF THE INVENTION

1. Field of the Invention

This invention relates generally to semiconductor processing, and more particularly to semiconductor chip crack stops and to methods of making the same.

2. Description of the Related Art

Cracks can wreak havoc on the delicate circuit structures of conventional semiconductor chips. Such cracks can arise from a number of sources. One common source is stresses imparted at singulation. Conventional semiconductor chips are routinely fabricated en masse in large groups as part of a single semiconductor wafer. At the conclusion of the processing steps to form the individual dice, a so-called dicing or sawing operation is performed on the wafer to cut out the individual dice. Thereafter, the dice may be packaged or directly mounted to a printed circuit board of one form or another. Conventional semiconductor dice are routinely cut out from the wafer as rectangular shapes. By definition, a conventional semiconductor die has four sides and four corners. The dicing operation is a mechanical cutting operation performed with a type of circular saw or perhaps a laser. Dicing saws are made with great care and operate more precisely than a comparable masonry circular saw. Despite these refinements, the dicing saw still imposes significant stresses on the individual dice as they are cut. These stresses and impact loads during the cutting operation can cause microscopic fractures in the dice, particularly at the die corners. Once the cut dice are mounted to a package substrate or printed circuit board of one sort or another, the cracks introduced during cutting may propagate further into the center of the dice due to thermal stresses and other mechanical stresses that may be placed on the die. In addition, new cracks may form, particularly near the corners which create so-called stress risers by virtue of their geometries.

A conventional technique for addressing the propagation of cracks from the corners of a die involves the use of a crack stop. A conventional crack stop consists of a frame-like structure formed in and near the edges of the semiconductor die. When viewed from above, the crack stop looks like a picture frame. The conventional crack stop does not extend out to the edges of the conventional die. Because of this geometry, a crack propagating from the corner of a die can achieve a significant length before encountering the die crack stop. If the crack achieves a certain critical length before encountering the conventional crack stop, the crack can become virtually uncontrollable. The crack can overwhelm the conventional crack stop and invade the active portion of the semiconductor die and lay waste to the delicate circuit structures positioned therein.

Another source of potentially damage-causing cracks is a weakness at the interface between an under bump polyimide layer and an underfill material layer. In a typical semiconductor chip mounted to a package substrate by a controlled collapse processing, an array of solder joints electrically connects the chip to the underlying substrate. The mounting establishes an interface region bounded vertically on one side by the package substrate and on the other by a polyimide layer. The conventional polyimide layer is a continuous sheet that blankets the front side of the semiconductor chip. A neutral point, usually though not necessarily located at the center of the chip, represents an area of substantially zero thermal strain. Solder joints in or near this area suffer low strains. However, proceeding outward from the neutral point, the die and underlying substrate begin to exhibit thermal strains that depend on temperature, coefficient of thermal expansion (CTE) and distance from the neutral point. A substrate usually has CTE that is six to seven times larger than the CTE of the chip. To address issues of differential CTE, an underfill material is deposited between the polyimide layer of the semiconductor chip and the package substrate and hardened by a curing process.

Crack propagation initiates at or in the proximity of the polyimide-to-underfill interface and grows. As a crack grows in length its driving forces increase. Once a crack has gained a critical driving force or so-called "critical energy release rate" the crack will gain enough energy to penetrate through the active bumps and permanently damage the packaged device.

A conventional technique to compensate for polyimide-to-underfill interface cracks involves a roughening of the polyimide sheet surface. The increase in interface strength is directly proportional to the increase in interface area. However, even with roughening, the increase in area may be quite small.

The present invention is directed to overcoming or reducing the effects of one or more of the foregoing disadvantages.

SUMMARY OF THE INVENTION

In accordance with one aspect of the present invention, a method of manufacturing is provided that includes providing a semiconductor chip that has a side and forming a polymer layer on the side. The polymer layer has a central portion and a first frame portion spatially separated from the central portion to define a first channel.

In accordance with another aspect of the present invention, a method of manufacturing is provided that includes providing a semiconductor chip that has a side and forming a polymer layer on the side. The polymer layer has a central portion and a first frame portion spatially separated from the central portion to define a first channel. The semiconductor chip is coupled to a substrate with the side facing towards but separated from the substrate to leave an interface region. An underfill is placed in the interface region. A portion of the underfill invades the channel to establish a mechanical joint between the polymer layer and the underfill.

In accordance with another aspect of the present invention, an apparatus is provided that includes a semiconductor chip that has a side and a polymer layer on the side. The polymer layer has a central portion and a first frame portion spatially separated from the central portion to define a first channel.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip with a crack resistant polymer layer are described herein. One example includes a semiconductor chip with a side on which a polymer layer is applied. The polymer layer has a central portion and a first frame portion spatially separated from the central portion to define a first channel. During a subsequent underfill process, underfill material fills into the channel to create a crack resistant interface. Additional details will now be described.

Figure 1:
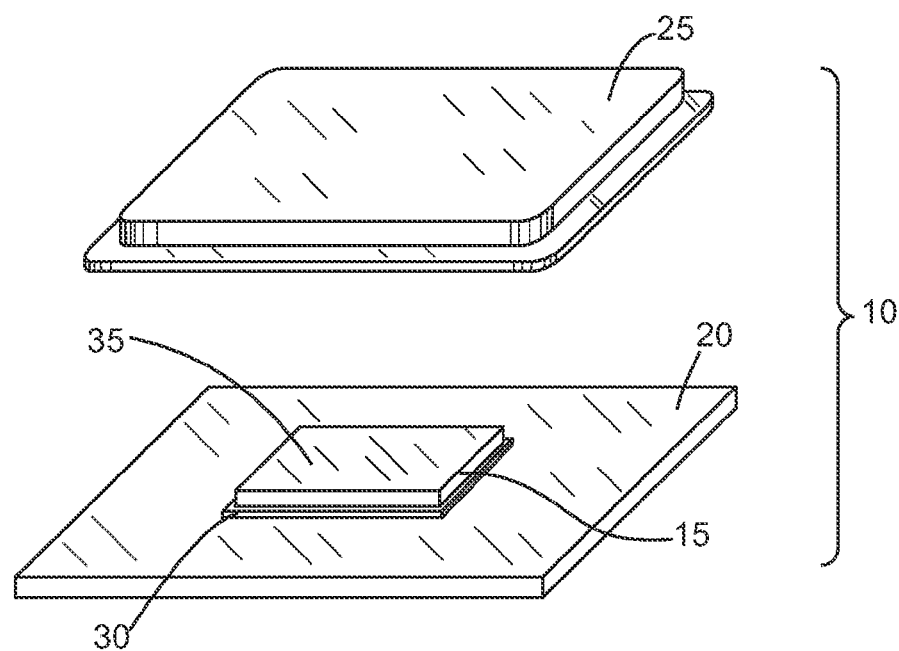
FIG. 1 is a partially exploded pictorial view of an exemplary embodiment of a semiconductor chip package that includes a semiconductor chip mounted on a package substrate.
Figure 2:
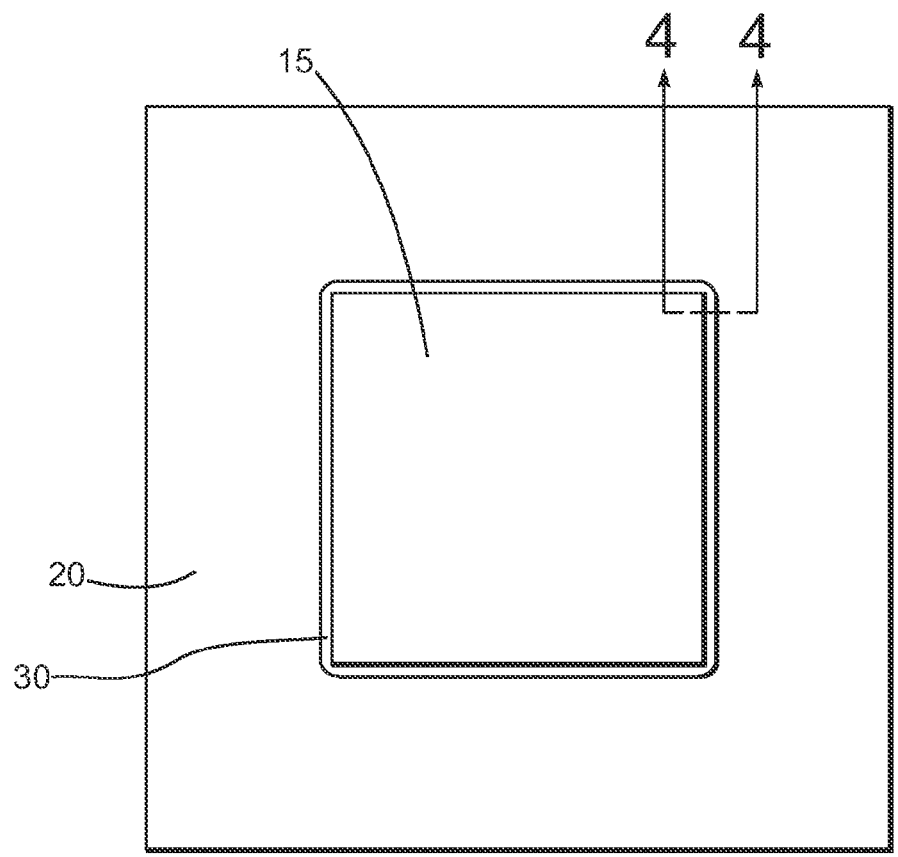
FIG. 2 is an overhead view of the semiconductor chip package of FIG. 1.

In the drawings described below, reference numerals are generally repeated where identical elements appear in more than one figure. FIG. 1 is a partially exploded pictorial view of an exemplary embodiment of a semiconductor chip package 10 that includes a semiconductor chip 15 mounted on a package substrate 20. The package 10 may be provided with a lid 25 that is shown exploded from the package substrate 20. A small portion of an underfill material layer 30 is visible at the periphery of the semiconductor chip 15. FIG. 2 is an overhead view of the package 10 without the optional lid 25. The backside 35 of the semiconductor chip 15 is visible in both FIGS. 1 and 2.

The semiconductor chip 15 may be flip-chip mounted to the substrate 20 as shown and electrically connected to conductors in the substrate 20 by interconnects that are not visible in FIG. 1 but will be shown in subsequent figures. The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core. The semiconductor chip 15 may be fabricated using silicon, germanium or other semiconductor materials. If desired, the chip 15 may be fabricated as a semiconductor-on-insulator substrate or as bulk semiconductor. The semiconductor chip 15 may be electrically interconnected with the substrate 20 by a plurality of conductor structures that are not visible in FIG. 1.

The substrate 20 may be composed of ceramics or organic materials as desired. If organic, the substrate 20 may actually consist of multiple layers of metallization and dielectric materials that electrically interconnect the semiconductor chip 15 to some other component, such as a board (not shown). The substrate 20 may interconnect electrically with external devices, such as another circuit board, in a variety of ways, such as via a pin grid array, a land grid array, a ball grid array or other configuration. The number of individual layers for the substrate 20 is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill. Of course, the substrate 20 could be configured as something other than a package substrate, such as a printed circuit board serving as a motherboard, a daughter board, a card or some other type of board.

The underfill material 30 is designed to lessen the effects of differences in CTE between the chip 15 and the substrate 20. The underfill material 30 may be composed of well-known epoxy materials, such as epoxy resin with or without silica fillers and phenol resins or the like. Two examples are types 8437-2 and 2BD available from Namics.

The optional lid 25 may be configured as a top hat design as disclosed, as a bathtub design or some other configuration. The lid 25 may be composed of well-known plastics, ceramics or metallic materials as desired. Some exemplary materials include nickel plated copper, anodized aluminum, aluminum-silicon-carbon, aluminum nitride, boron nitride or the like. The lid 25 may be secured to the substrate 20 by an adhesive composed of a well-known thixotropic adhesive or other well-known type of package adhesive as desired. However, the lid 25 may be omitted entirely if a lidless design is desired.

Figure 3:
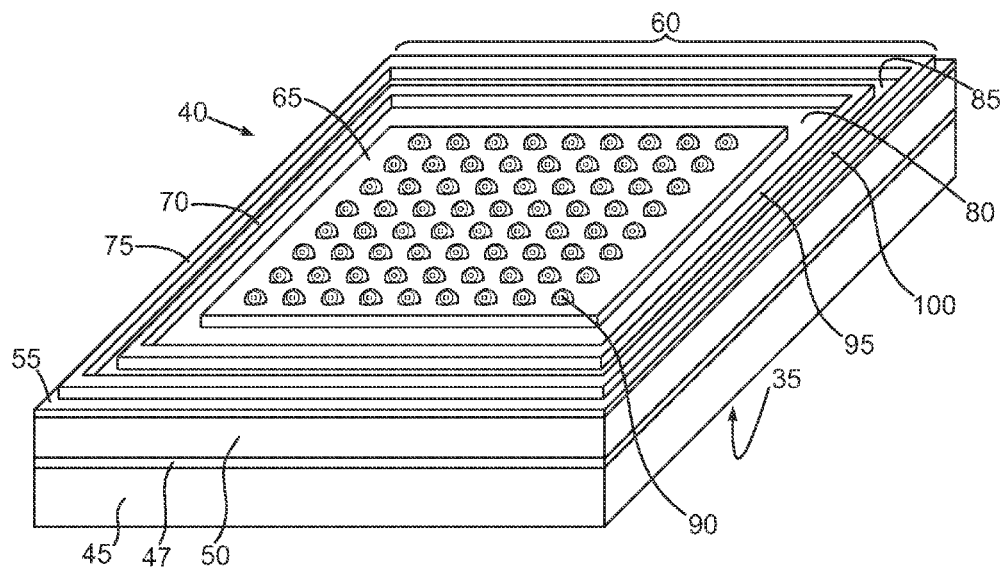
FIG. 3 is a pictorial view of an exemplary semiconductor chip flipped over to reveal a crack stop polymer layer on a front side thereof.

Additional details of the semiconductor chip 15 may be understood by referring now to FIG. 3, which is a pictorial view of the semiconductor chip 15 flipped over to reveal a front side 40. In this view, the backside 35 of the semiconductor chip 15 is obscured. The semiconductor chip 15 may include a bulk semiconductor portion 45, an active circuitry layer 47 positioned on the bulk semiconductor layer 45 and an interconnect layer 50 positioned on the active circuitry layer 47. If the chip 15 is implemented as a semiconductor on insulator design, then a buried insulating layer may be positioned either within the active circuitry layer 47 or in between the circuitry layer 47 and the underlying bulk semiconductor layer 45. The active circuitry layer 47 includes the multitudes of transistors, capacitors, resistors and other circuit devices that perform various functions. The interconnect layer 50 may consist of plural stacked conductor and interlevel dielectric layers.

A thin passivation layer 55 is provided on the interconnect layer 50 and may actually consist of a stack of multiple layers, starting with a silicon carbide adhesion layer that facilitates adhesion to the upper stretches of the device layer 50. On top of that may be formed a stack of passivation layer materials, such as, for example, silicon nitride and silicon dioxide or other types of dielectric materials. The number of alternating layers of silicon dioxide and silicon nitride is subject to great variety. In an exemplary embodiment, a total of six layers of three each of silicon dioxide and silicon nitride may be provided. It should be understood that the device layer 50 may include not only various active devices formed in the semiconductor material but also plural interconnect layers that stack up sequentially from the various semiconductor devices.

A polymer layer 60 is formed on the passivation structure 55 and may consist of a central portion 65, an inner frame 70 and an outer frame 75. The inner frame 70 is spatially separated from the central portion to define a channel 80. The outer frame 75 is spatially separated from the inner frame to define another channel 85. The channels 80 and 85 may be formed around entire perimeters of the central portion 65 and the inner frame 70, respectively. Optionally, the frames 70 and 75 could be linked by small fingers (not shown). In this illustrative embodiment, the frames 70 and 75 and channels 80 and 85 have generally rectangular footprints. However, other shapes are possible. In addition, the number of frames and channels can be one or more as desired. In another variant, the frames 70 and 75 could be segmented. If segmented, the segments should be offset so that a pathway for crack propagation is not established.

A plurality of conductor structures or bumps 90 are formed on the central portion 65 of the polymer layer 60 and are electrically connected to various interconnect structures in the interconnect layer 50 that are not visible in FIG. 3. A few tens of the conductor structures 90 are depicted, however, the skilled artisan will appreciate that there may be scores, hundreds or even thousands of such conductor structures depending upon the complexity and size of the semiconductor chip 15.

The polymer layer 60 is designed to protect the underlying passivation structure 55 and the various circuit structures that are in the upper reaches of the device layer 50. Exemplary materials for the polymer layer 60 include, for example, polyimide, benzocyclobutene or the like. Spin coating, chemical vapor deposition or other deposition processes may be used to apply the polymer layer 60. Well-known lithography techniques may be used to pattern the inner and outer frames 70 and 75 and channels 80 and 85. In this illustrative embodiment, the polymer layer 60 is composed of polyimide. The inner and outer frames 70 and 75 are designed to serve as crack stops to prevent cracks in the underfill material layer 30 depicted in FIGS. 1 and 2 from propagating into the interior reaches of the chip 15 and the conductor structures 90. To aid in the understanding of the structures depicted in FIG. 4, it may be useful to separately label a leg 95 of the inner frame 70 and a leg 100 of the outer frame 75. The legs 95 and 100 will be visible in FIG. 4.

Figure 4:
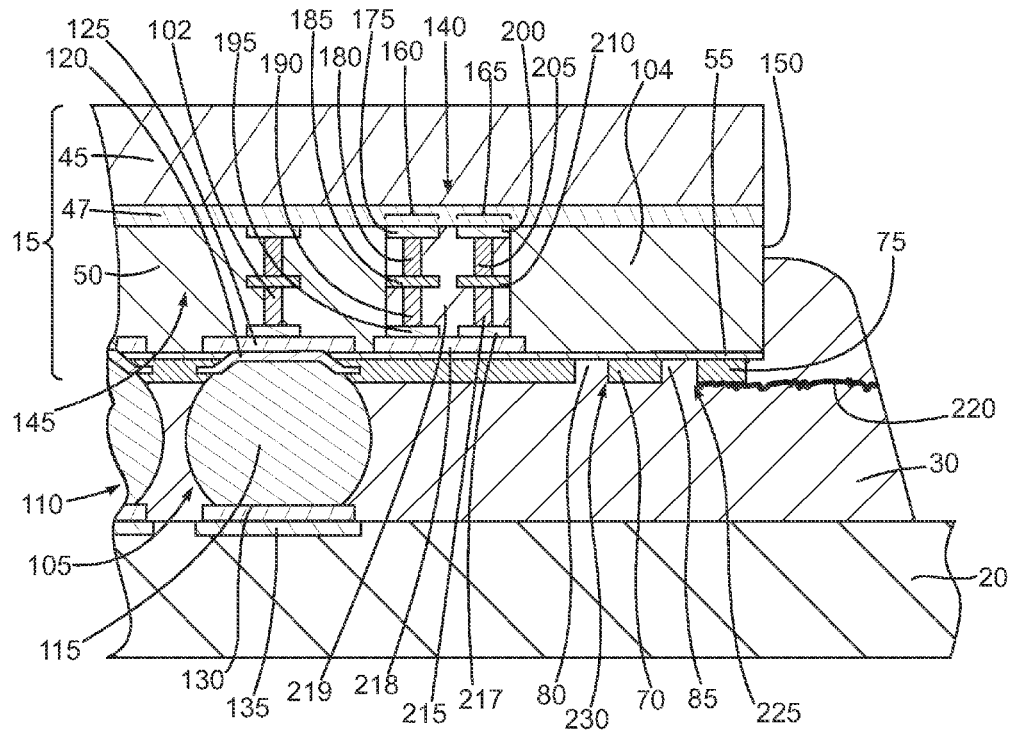
FIG. 4 is a sectional view of FIG. 2 taken at section 4-4.

FIG. 4 is a sectional view of FIG. 2 taken at section 4-4. The interconnect layer 50 may consist of multiple layers of interconnect structures, one of which is visible and labeled 102, and interlevel dielectric material 104, which may consist of multiple built-up layers. The semiconductor chip 15 is electrically interconnected with the substrate 20 by way of a plurality of interconnects, two of which are visible and labeled 105 and 110, respectively. The interconnects 105 and 110 are part of an array of interconnects between the semiconductor chip 15 and the substrate 20 that may number into the hundreds or even thousands. The array of interconnects 105 and 110 may be regular or irregular in shape and spacing. The description of the interconnects 105 and 110 herein will be illustrative of the remainder of the semiconductor chip 15. The interconnect 105 may consist of a solder joint 115 that is metallurgically bonded to a conductor structure or under bump metallization layer (UBM) 120 that is formed in the central portion 65 of the polymer layer 60. The solder joint 115 may be formed by the metallurgical union of one of the solder bumps 90 depicted in FIG. 3 and another solder structure positioned on the substrate 20. Various solders may be used, such as lead-based or lead-free solders represent two examples. In an exemplary process, a high lead solder such as (97 Pb 3 Sn) may be used for the bump 90 and a eutectic tin-lead solder combination may be used for the portion of solder nearer to the substrate 20. The UBM layer 120 is, in turn, metallurgically connected to a bump pad 125 in the semiconductor layer 105. In terms of function, the UBM layer 125 is designed to prevent diffusion of constituents of the pad 125 into the solder joint 115. The semiconductor chip 15 includes an array of such conductor structures or UBM structures 120 to accommodate plural solder joints. In an exemplary embodiment where copper is used as the material for the pad 125, the UBM 120 may consist of a stack of chrome, copper and nickel deposited by physical vapor deposition or other well-known techniques. The bump pad 125 may be composed of copper, gold, silver, combinations of these or the like. On the opposite side, the solder joint 115 is metallurgically bonded to a bump pad 130 that is in turn connected to another pad 135. The pads 130 and 135 and may be composed of nickel, gold, copper, silver, palladium combinations of these or the like. The interconnect 110 may have the same configuration, however, the separate elements of the joint 100 are not separately labeled for simplicity of illustration. The pad 130 is electrically connected to other portions of the chip 15 by way of conductor structures that are not visible. The same is true for the pad 135 albeit in the context of conductor structures that are in the substrate 20. In another embodiment, the interconnects 105 and 110 may consist of conductive pillars of copper, silver, gold, aluminum, combinations of these or the like tied to the semiconductor chip 15 and the substrate 20 by solder.

The semiconductor chip 15 may be provided with an internal crack structure stop region 140 that may consist of a conventionally fabricated picture frame style crack stop structure fabricated from one or more sets of multiple level metal interconnect structures that may be patterned at the same time as other conductor structures in the semiconductor chip 15. The purpose of the crack stop region 140 is to protect an interior portion 145 of the semiconductor chip 15 from cracks that may propagate from an edge 150 into the interior 145 where the critical circuit structures of the semiconductor chip 15 are positioned. The crack stop region 140 may consist of well-known collections of multi-layer conductor structures, two of which are shown and labeled 160 and 165 and each of which consists of multiple conductor structures 175, 180, 185, 190, 195, 200, 205, 210, 215 and 217. The crack stop structure 140 may be capped with a bump pad 218 that is structurally similar to and fabricated at the same time as the bump pad 130. The conductor structures 175, 180, 185, 190, 195, 200, 205, 210, 215 and 217 may be interspersed in the dielectric 104 that may be multi-level, but is shown as a single structure for simplicity of illustration. The conductor structures 175, 180, 185, 190, 195, 200, 205, 210, 215 and 217 may be composed of a variety of materials. Some desirable properties include mechanical strength to resist stresses associated with differential thermal expansion and crack propagation, thermal expansion properties that do not mismatch those of the semiconductor chip 15 and the substrate 20, and ease of manufacture. Exemplary materials include copper, aluminum, gold, silver, palladium, platinum, combinations of these or the like. Another potential material is carbon nanotubes in an epoxy matrix. It should be understood that the number of layers of the crack stop structure 140 may be varied. For example, it may be advantageous to build up the crack stop region 140 in layers using the same masking, etching and material deposition processes used to fabricate the interconnect layers (e.g., the structure 102).

Assume for the purposes of illustration that a crack 220 has formed in the under fill 30 and is proceeding laterally towards the wall portion 100 of the outer frame of the polymer layer. When the crack 220 encounters the channel 85 between the outer wall portion 100 and the inner wall portion 95, the presence of the underfill 30 at the point 225 will tend to stop the crack 220 from propagating further along the interface between the underfill 30 and the leg 100. The same would be true if, for example, the crack 220 had propagated laterally even further and encountered the point 230 in the underfill 30. This follows from the fact that the channel 80 and 85 allow the underfill 30 to invade and form mechanical joints that will prohibit the propagation of cracks laterally toward the interior portions of the semiconductor chip 15 and/or the interconnects 105 and 110.

Figure 5:
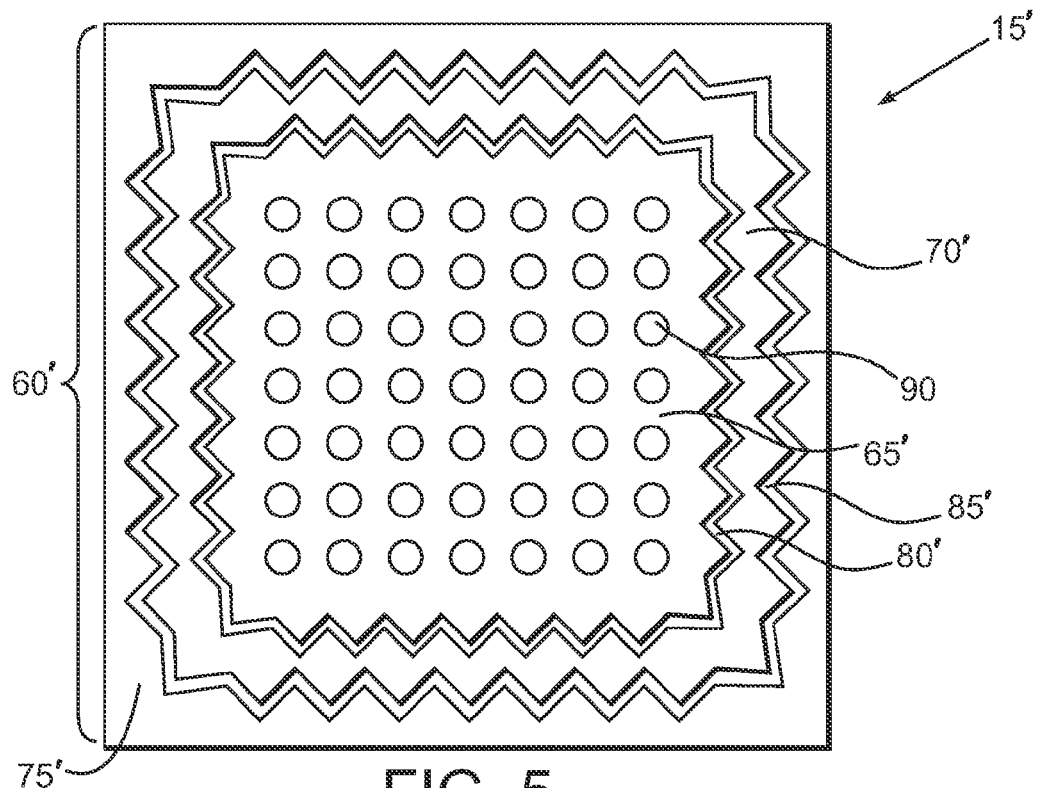
FIG. 5 is an overhead view of an alternate exemplary embodiment of a semiconductor chip depicting an alternate exemplary crack stop polymer layer.

In the foregoing illustrative embodiment, the channels 80 and 85 between the inner and outer frames 70 and 75 have generally rectangular footprints. However, the channels and frames may take on a variety of arrangements. One such alternative embodiment is illustrated in FIG. 5, which is an underside view of a semiconductor chip 15' that is provided with a polymer layer 60' that may consist of a central portion 65', an inner frame portion 70' and an outer frame portion 75'. Again, an array of solder bumps 90 is shown projecting from the central portion 60'. The inner frame 70' is separated from the central portion 65' by way of a channel 80' and the outer frame 75' is separated laterally from the inner frame 70' by way of a channel 85'. Here, the channels 80' and 85' are fabricated in a serpentine arrangement. A serpentine arrangement may be advantageous because it provides a larger perimeter that, in-turn, provides a greater area of mechanical as opposed to merely chemical bonding between a subsequently deposited underfill and the polymer layer 60'. Of course, different shapes may be combined. For example, one frame or channel could be serpentine and another rectangular or some other shape.

Figure 6:
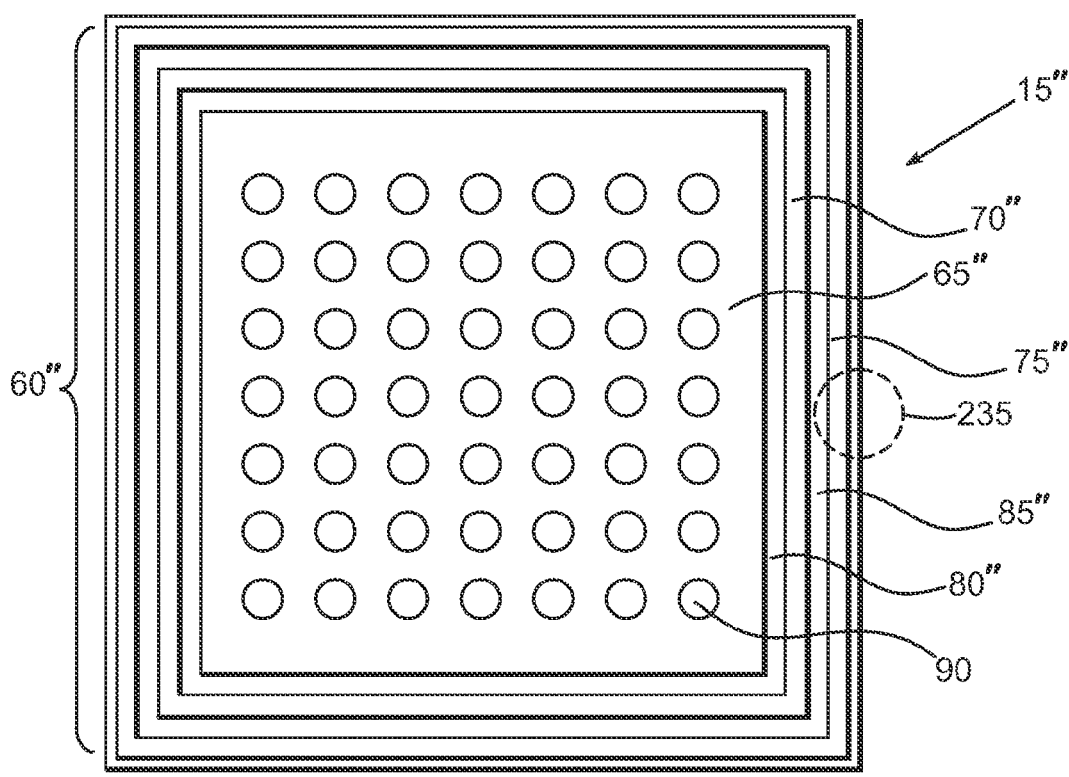
FIG. 6 is an overhead view of another exemplary embodiment of a semiconductor chip depicting another alternate exemplary crack stop polymer layer.

Another alternate exemplary embodiment of a semiconductor chip 15'' is depicted in FIG. 6, which is an underside view like FIG. 5. This illustrative embodiment may be quite similar to the embodiment of the chip 15 depicted in FIG. 3. In this regard, the semiconductor chip 15'' may include a polymer layer 60'' that consists of a central portion 65'', an inner frame 70'' and an outer frame 75'' where the inner frame 70'' and the central portion 65' are separated by a channel 80'' and the outer frame 75'' may be separated from the inner frame 70'' by way of a channel 85''. Again an array of solder bumps 90 projects upward from the central portion 65''. A small portion of the chip 15'' is circumscribed by a dashed circle 235. The portion circumscribed by the dashed circle 235 will be shown at much greater magnification in FIG. 7 so that additional features of the outer frame 75'' may be illustrated.

Figure 7:
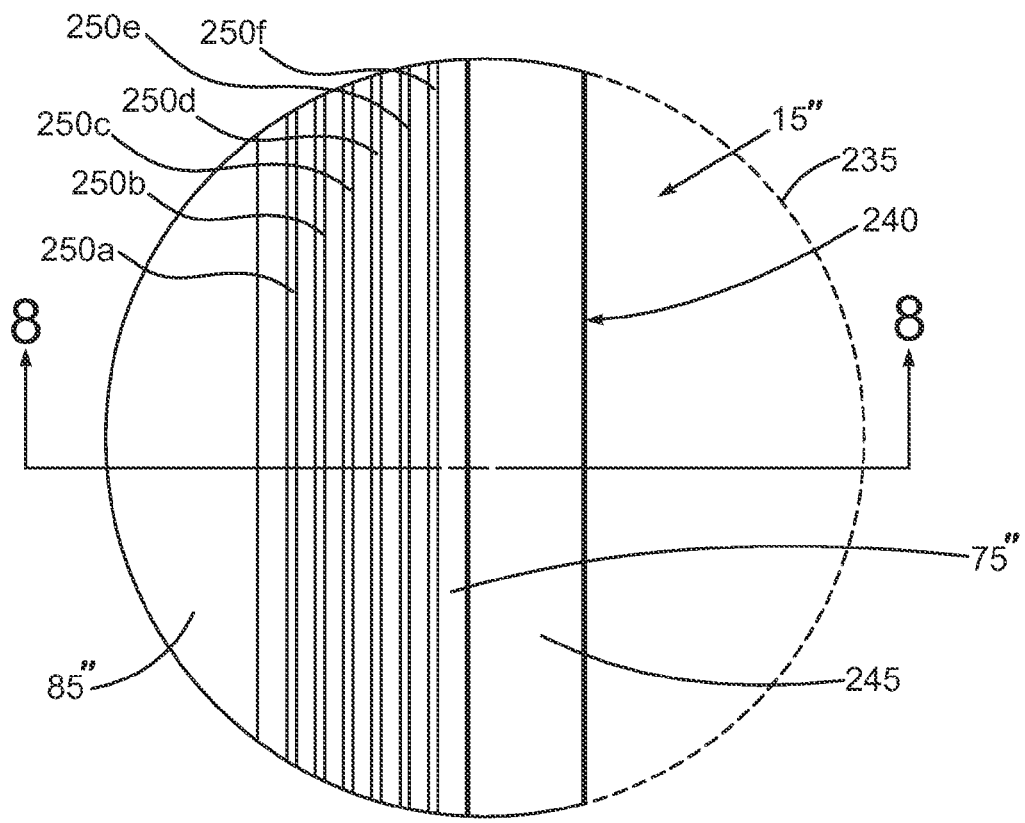
FIG. 7 is an overhead of a selected portion of FIG. 6 shown at greater magnification.

Attention is now turned to FIG. 7, which as just noted, is the portion of FIG. 6 circumscribed by the dashed oval 235 shown at greater magnification. The outer frame 75'' is visible along with the portion of the channel 85'' and the edge 240 of the chip 15''. The portion of the semiconductor chip 15'' positioned to the right of the frame 75'' and labeled 245 may consist of a passivation stack of the type depicted in FIGS. 3 and 4 and labeled 55. The outer frame 75'' may include a plurality of grooves 250a, 250b, 250c, 250d, 250e and 250f. The purpose of the grooves 250a, 250b, 250c, 250d, 250e and 250f is to provide spaces in which a subsequently deposited underfill material may invade and form plural micro-mechanical joints between the underfill with the outer frame 75''. The number of grooves 250a, 250b, 250c, 250d, 250e and 250f is largely a matter of design discretion and may number one or more. Although the grooves 250a, 250b, 250c, 250d, 250e and 250f and the outer frame 75'' are depicted as being continuous along the axis 253, it should be understood that the grooves 250a, 250b, 250c, 250d, 250e and 250f and the outer frame 75'' could be fabricated as respective groups of segments that extend along the axis 253. Indeed, the entire outer frame 75'' could be segmented for this or the other embodiments disclosed herein. If desired, the grooves 250a, 250b, 250c, 250d, 250e and 250f may extend around the entire perimeter of the outer frame 75''. A corresponding groove or set of grooves (not visible) may be provided in the inner frame 70'' as well.

Figure 8:
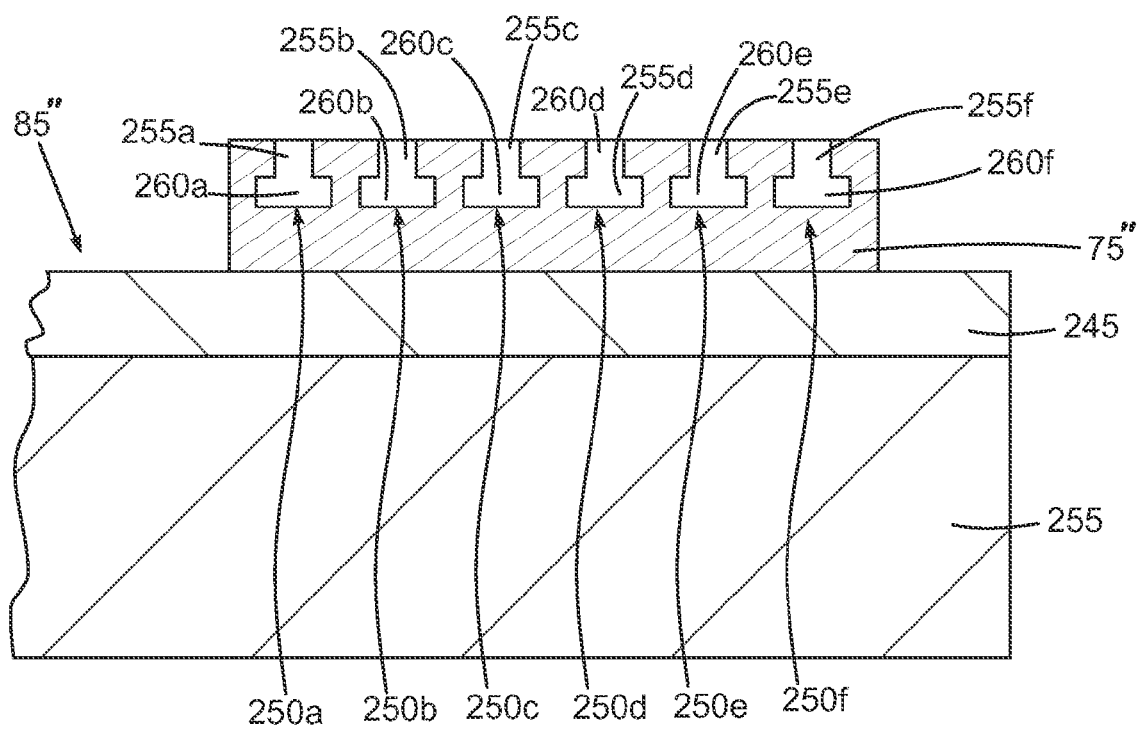
FIG. 8 is a sectional view of FIG. 7 taken at section 8-8.
Figure 9:
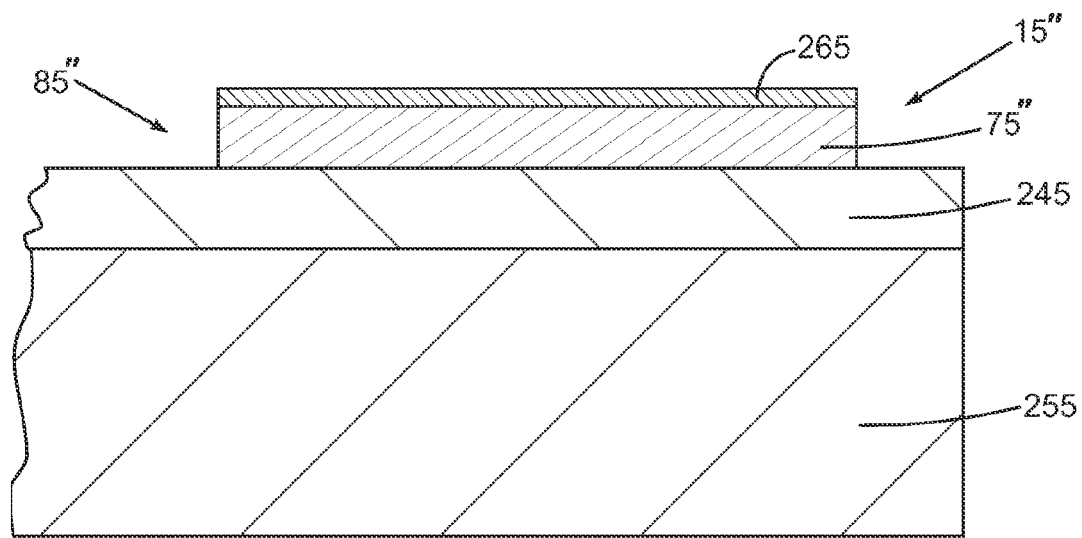
FIG. 9 is a sectional view like FIG. 8 depicting exemplary steps to fabricate a polymer crack stop layer.

Additional details of the grooves 250a, 250b, 250c, 250d, 250e and 250f may be understood by referring now also to FIG. 8, which is a sectional view of FIG. 7 taken at section 8-8. For simplicity of illustration, the semiconductor chip 15'' is depicted with a single monolithic structure 255 upon which the passivation stack 245 is formed. It should be understood that the monolithic structure 255 may in fact consist of the multiple layers, for example, 45, 47, 50 and 55 depicted in FIGS. 3 and 4. The grooves 250a, 250b, 250c, 250d, 250e and 250f may consist of upper portions 255a, 255b, 255c, 255d, 255e and 255f and relatively wider lower portions 260a, 260b, 260c, 260d, 260e and 260f. When underfill (not shown) invades the grooves 250a, 250b, 250c, 250d, 250e and 250f and hardens during a curing process, the respective upper portions 255a, 255b, 255c, 255d, 255e and 255f and lower portions 260a, 260b, 260c, 260d, 260e and 260f will establish mechanical joints not unlike several small tongue and groove joints.

Figure 10:
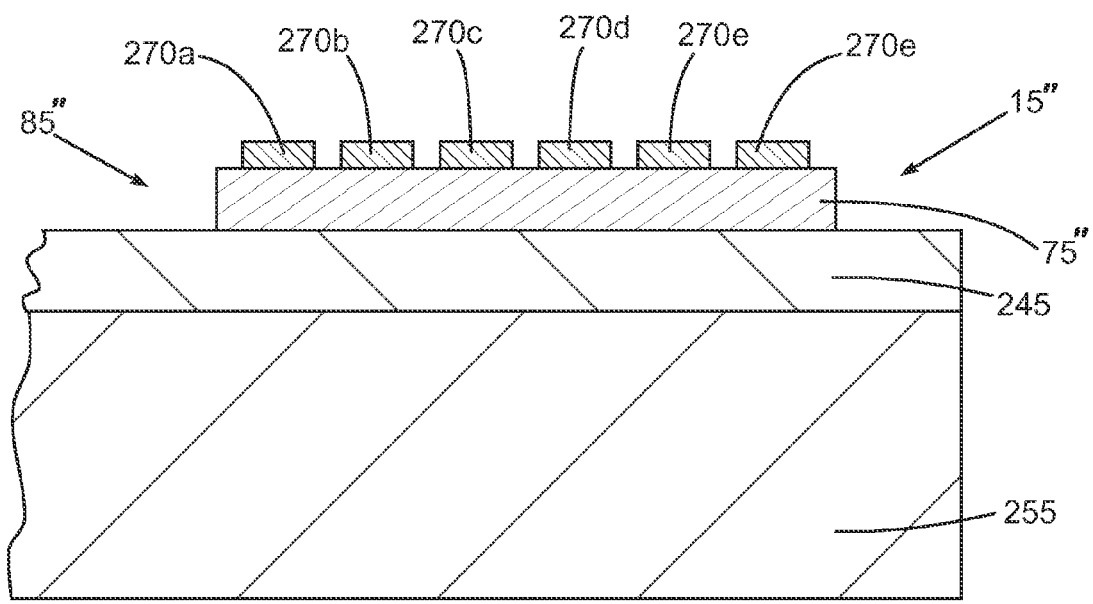
FIG. 10 is a sectional view like FIG. 9 depicting additional exemplary steps to fabricate a polymer crack stop structure.

An exemplary method for fabricating the grooves 250a, 250b, 250c, 250d, 250e and 250f will now be described in conjunction with FIGS. 9, 10, 11, 12 and 13. The description will focus on the outer frame 75'', but will applicable to the inner frame 70'' shown in FIG. 6 as well. Beginning with FIG. 9, following the formation of the passivation stack 245 on the main portion 255 of the chip 15'', the outer frame 75'' and channel 85'' may be fabricated by well-known material deposition and lithography steps. At this stage, a sacrificial oxide layer 265 is formed on the outer frame 75'' by way of well-known chemical vapor deposition or other material deposition techniques. Referring now to FIG. 10, the sacrificial oxide layer 265 is appropriately masked and subjected to an etch process to define plural segments 270a, 270b, 270c, 270d, 270e and 270f. This etch may be a dry etch or wet etch process. The channel 85'', the passivation stack 245 on the main chip portion 255 and the outer frame 75'' may be masked during the etch to prevent attack.

Figure 11:
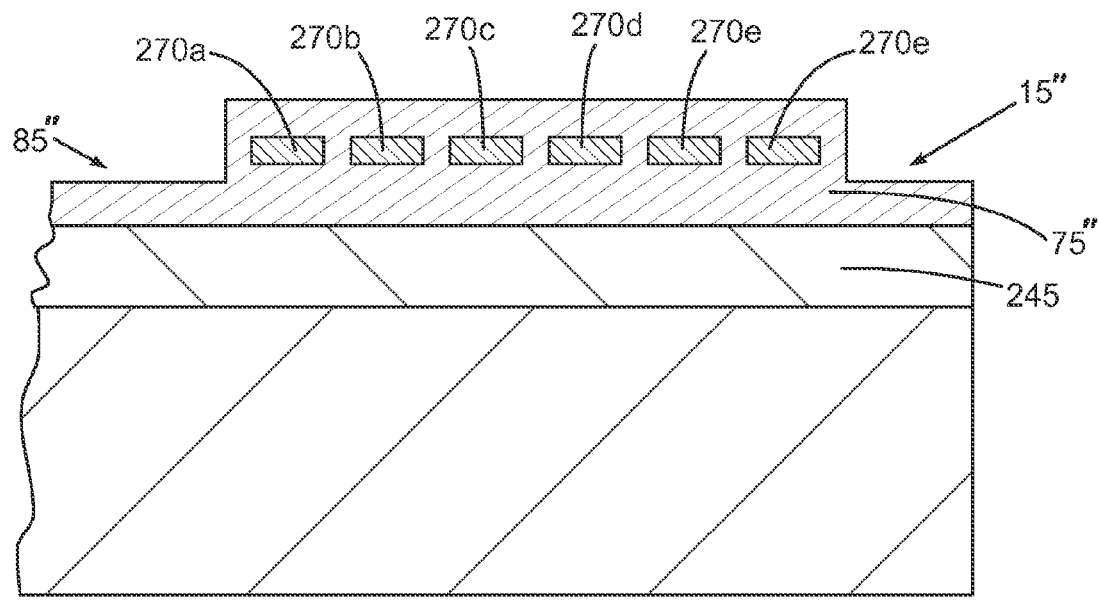
FIG. 11 is a sectional view like FIG. 10 depicting additional exemplary steps to fabricate a polymer crack stop structure.
Figure 12:
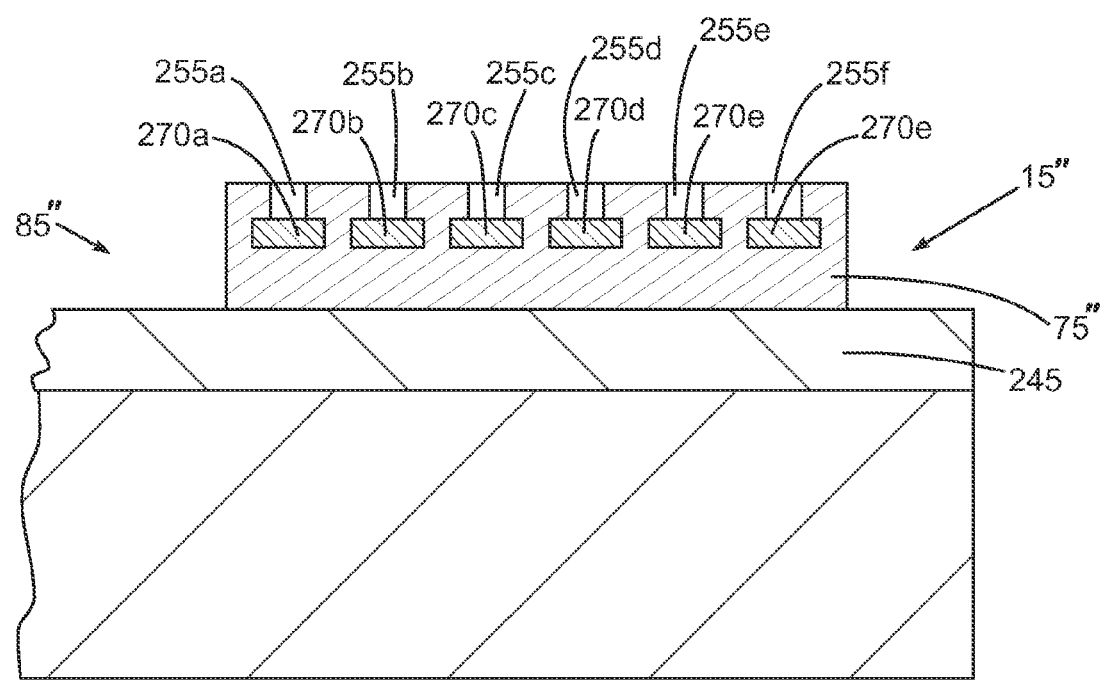
FIG. 12 is a sectional view like FIG. 11 depicting additional exemplary steps to fabricate a polymer crack stop structure.

Referring now to FIG. 11, the outer frame 75'' is increased in height by way of a material deposition step that covers the previously formed segments 270a, 270b, 270c, 270d, 270e and 270f of sacrificial oxide. This may be accomplished by merely depositing an additional volume of the polymer material. Some of the additional polymer material 275 may be actually deposited into the channel 85'' and on other portions of the passivation stack 245. This additional polymer material 275 may be subsequently removed by appropriate masking and etching if desired. Referring now to FIG. 12, the outer frame 75'' may be appropriately masked and directionally etched to establish the upper trench portions 255a, 255b, 255c, 255d, 255e and 255f in the frame 75'' that extend down to the sacrificial oxide segments 270a, 270b, 270c, 270d, 270e and 270f. The etch may be used to clear excess polymer material from portions of the semiconductor chip 15'', such as the channel 85'' and other portions of the passivation stack 245.

Figure 13:
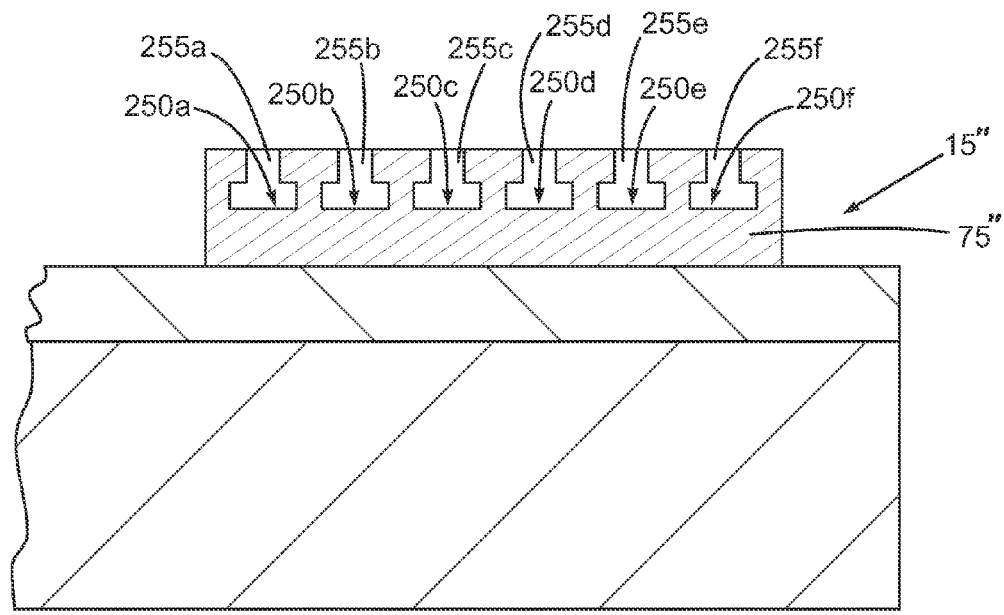
FIG. 13 is a sectional view like FIG. 12 depicting additional exemplary steps to fabricate a polymer crack stop structure.

Referring now to FIG. 13, a wet etch process is performed to remove the sacrificial oxide segments and thus leave the aforementioned grooves 250a, 250b, 250c, 250d, 250e and 250f in the outer frame 75''. The upper trench portions 255a, 255b, 255c, 255d, 255e and 255f enable the wet etchant solution to reach and etch the sacrificial oxide segments 270a, 270b, 270c, 270d, 270e and 270f. It should be understood that the patterning of the inner and outer frames of any of the disclosed embodiments may be done while the semiconductor chip 15" is part of a larger semiconductor workpiece, such as a wafer, or after singulation if desired. The same is true for any of the embodiments disclosed herein.

Figure 14:
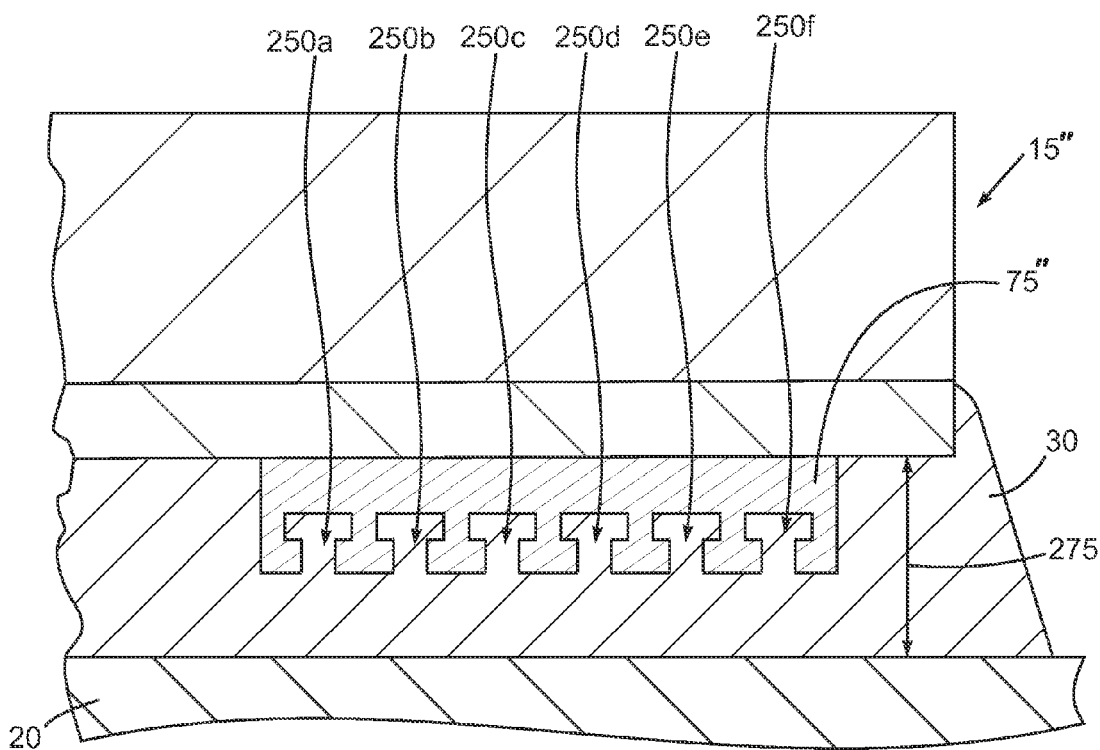
FIG. 14 is a sectional view depicting an exemplary engagement of underfill to a polymer crack stop layer.

To illustrate the mechanical advantage of the plural grooves 250a, 250b, 250c, 250d, 250e and 250f in the outer frame 75", attention is now turned to FIG. 14, which depicts the semiconductor chip 15" flip-chip mounted to the package substrate 20 and subsequent to the deposition of the underfill material 30. Prior to the underfill 30 deposition, the semiconductor chip 15" is moved into position relative to the substrate 20 and, for example, a controlled collapse and reflow process is performed to establish plural solder joints, an example of which is labeled 105 in FIG. 3. At this point, the underfill material 30 may be deposited and capillary action used to spread the underfill through an interface 275 between the semiconductor chip 15" and the substrate 20. Optionally, a flowless underfill process may be used in which the underfill material is deposited on the substrate 20 prior to the bumping. The underfill 30 invades the grooves 250a, 250b, 250c, 250d, 250e and 250f to form a plurality of micro-mechanical joints with the outer frame 75". These T-shaped joints provide both a structural joint as well as chemical bonding between the underfill 30 and the outer frame 75". The skilled artisan will appreciate that the number and spacing of the grooves 250a, 250b, 250c, 250d, 250e and 250f may be varied greatly depending upon the available process, minimum feature size and lithography techniques, etc.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
providing a semiconductor chip having a passivation layer; and
forming a polymer layer on the passivation layer with a central portion and a first frame portion spatially separated from the central portion to define a first channel that extends to but not through the passivation layer.

2. The method of claim 1, comprising coupling a plurality of solder structures to the central portion.

3. The method of claim 1, comprising forming the first frame portion with a rectangular footprint.

4. The method of claim 1, comprising forming the first frame portion to define the first channel with a serpentine footprint.

5. The method of claim 1, comprising forming a groove in a surface of the first frame portion facing away from the passivation layer of the semiconductor chip.

6. The method of claim 5, wherein the groove extends around a perimeter of the first frame portion.

7. The method of claim 1, comprising forming the polymer layer with a second frame portion spatially separated from the first frame portion to define a second channel.

8. A method of manufacturing, comprising:
forming a polymer layer on a passivation layer of a semiconductor chip, the polymer layer having a central portion and a first frame portion spatially separated from the central portion to define a first channel that extends to but not through the passivation layer;
coupling the semiconductor chip to a substrate with the side facing towards but separated from the substrate to leave an interface region; and
placing an underfill in the interface region, a portion of the underfill invading the channel to establish a mechanical joint between the polymer layer and the underfill.

9. The method of claim 8, comprising forming a plurality of interconnects between the semiconductor chip and the substrate.

10. The method of claim 9, wherein the interconnects comprise solder joints.

11. The method of claim 8, comprising forming the first frame portion with a rectangular footprint.

12. The method of claim 11, comprising forming the first frame portion to define the first channel with a rectangular footprint.

13. The method of claim 8, comprising forming the first frame portion to define the first channel with a serpentine footprint.

14. The method of claim 8 comprising forming a groove in a surface of the first frame portion facing away from the passivation layer of the semiconductor chip.

15. The method of claim 14, wherein the groove extends around a perimeter of the first frame portion.

16. The method of claim 10, comprising forming the polymer layer with a second frame portion spatially separated from the first frame portion to define a second channel.

17. An apparatus, comprising:
a semiconductor chip having a passivation layer; and
a polymer layer on the passivation layer, the polymer layer having a central portion and a first frame portion spatially separated from the central portion to define a first channel that extends to but not through the passivation layer.

18. The apparatus of claim 17, comprising a plurality of solder structures coupled to the central portion.

19. The apparatus of claim 17, wherein the first frame portion comprises a rectangular footprint.

20. The apparatus of claim 19, wherein the first channel comprises a rectangular footprint.

21. The apparatus of claim 17, wherein the first channel comprises a serpentine footprint.

* * * * *